US008754392B2

(12) United States Patent
Caimi et al.

(10) Patent No.: US 8,754,392 B2
(45) Date of Patent: *Jun. 17, 2014

(54) CARBON-BASED MEMORY ELEMENT

(75) Inventors: Daniele Caimi, Rueschlikon (CH);
Evangelos S. Eleftheriou, Rueschlikon (CH); Charalampos Pozidis, Rueschlikon (CH); Christophe P. Rossel, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 395 days.

This patent is subject to a terminal disclaimer.

(21) Appl. No.: 13/169,171

(22) Filed: Jun. 27, 2011

(65) Prior Publication Data

US 2012/0001142 A1    Jan. 5, 2012

(30) Foreign Application Priority Data

Jun. 30, 2010  (EP) ................................. 10167998

(51) Int. Cl.
 *H01L 29/02*  (2006.01)
(52) U.S. Cl.
 USPC .... 257/2; 257/5; 257/E47.002; 257/E21.005; 438/382
(58) Field of Classification Search
 USPC ............ 257/2, 5, E47.002, E21.005; 438/382
 See application file for complete search history.

(56) References Cited

U.S. PATENT DOCUMENTS

| 7,768,016 | B2 | 8/2010 | Kreupl |
| 2009/0258489 | A1 | 10/2009 | Chen et al. |
| 2009/0283735 | A1 | 11/2009 | Li et al. |
| 2010/0012914 | A1 | 1/2010 | Xu et al. |
| 2010/0032643 | A1* | 2/2010 | Xu ..................................... 257/4 |
| 2010/0081268 | A1 | 4/2010 | Schricker et al. |
| 2010/0163824 | A1* | 7/2010 | Xu et al. ........................... 257/2 |
| 2010/0245029 | A1 | 9/2010 | Schricker et al. |
| 2013/0214239 | A1* | 8/2013 | Caimi et al. ...................... 257/4 |

FOREIGN PATENT DOCUMENTS

| JP | 2010141046 A | 6/2010 |
| WO | 2010017427 A1 | 2/2010 |
| WO | 2011106155 A2 | 9/2011 |

OTHER PUBLICATIONS

In Silva, Properties of Amorphous Carbon, IEEE Inspec, London, 2003, Only pp. 318-232, Section C.
International Search Report and Written Opion for International Application No. PCT/IB2011052790; International filing Date: Jun. 24, 2011, Date of mailing; Jan. 31, 2012; 22 pages.

* cited by examiner

*Primary Examiner* — Minh-Loan T Tran
(74) *Attorney, Agent, or Firm* — Patents on Demand P.A.; Brian K. Buchheit; Scott M. Garrett (57) ABSTRACT

One embodiment of the disclosure can provide a storage layer of a resistive memory element comprising a resistance changeable material. The resistance changeable material can include carbon. Contact layers can be provided for contacting the storage layer. The storage layer can be disposed between a bottom contact layer and a top contact layer. The resistance changeable material can be annealed at a predetermined temperature over a predetermined annealing time for rearranging an atomic order of the resistance changeable material.

24 Claims, 10 Drawing Sheets

Fig. 12 ary CARBON-BASED MEMORY ELEMENT

BACKGROUND

The present invention relates to manufacturing memory devices.

Memory devices are widely used in computing applications and in many electronic devices. For some applications, non-volatile memory which retains its stored data even when power is not present, may be used. For example, non-volatile memory is typically used in digital cameras, portable audio players, wireless communication devices, personal digital assistants, and peripheral devices, as well as for storing firmware in computers and other devices. A variety of conventional memory technologies have been developed. For example, non-volatile memory technologies are flash memory, magneto-resistive random access memory (MRAM), and phase change memory (PCM).

BRIEF SUMMARY

One embodiment of the disclosure can provide a storage layer of a resistive memory element comprising a resistance changeable material. The resistance changeable material can include carbon. Contact layers can be provided for contacting the storage layer. The storage layer can be disposed between a bottom contact layer and a top contact layer. The resistance changeable material can be annealed at a predetermined temperature over a predetermined annealing time for rearranging an atomic order of the resistance changeable material.

DETAILED DESCRIPTION

Due to the great demand for memory devices, researchers are continually improving memory technology and developing new types of memory, including new types of non-volatile memory and memory based on new materials. It is generally desirable to reduce the dimensions of the memory cells and reduce the complexity of peripheral circuitry used to operate the memory.

To increase the efficiencies of electronic devices their size is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is resistivity changing memory, which stores information based on changes in the resistivity of a memory element. Depending on the resistivity changing memory technology being used, the resistivity of the storage layer is typically switched between a low resistivity state and a high resistivity state through the application of voltage or current across the storage layer.

One conventional type of resistivity changing memory or resistive memory is known as phase change memory (PCM). The resistivity changing memory elements used in PCM are phase changing memory elements that include a phase changing material. The phase changing material can be switched between at least two different crystallization states (i.e. the phase changing material may adopt at least two different degrees of crystallization), wherein each crystallization state may be used to represent a memory state. When the number of possible crystallization states is two, the crystallization state having a high degree of crystallization is also referred to as "crystalline state", whereas the crystallization state having a low degree of crystallization is also referred to as "amorphous state". Different crystallization states can be distinguished from each other by their differing electrical properties and in particular by their different resistances. For example, a crystallization state having a high degree of crystallization (ordered atomic structure) generally has a lower resistance than a crystallization state having a low degree of crystallization (disordered atomic structure).

Usually, the phase changing material forming the storage layer of a conventional PCM consist of a chalcogenide compound material, such as GeSbTe (GST), SbTe, GeTe or AgInSbTe. Programming the PCM is mostly executed by a temperature change of the phase changing material. There is a variety of mechanisms to realize such a thermally induced phase change. Conventional PCM relies on specific materials that may pose difficulties in the manufacturing of memory cells. These difficulties have been overcome/minimized by embodiments of the disclosure.

According to an embodiment of a first aspect of the invention a method for manufacturing a resistive memory element is presented comprising the steps of: providing a storage layer comprising a resistance changeable material, wherein the resistance changeable material comprises carbon, providing contact layers for contacting the storage layer, wherein the storage layer is disposed between a bottom contact layer and a top contact layer; and annealing the resistance changeable material at a predetermined temperature over a predetermined annealing time for rearranging an atomic order of the resistance changeable material.

According to embodiments of the invention the programming voltage or programming power of the resistive memory element can be changed by annealing the resistance changeable material. According to further embodiments of the invention the resistance window of the resistive memory element can be tuned by an annealing process. Embodiments of the invention allow for altering and adapting the programming characteristics of a resistive memory element according to the needs of its actual application or implementation. For example, if a typically low threshold switching voltage is present, according to embodiments of the invention the voltage window for read operations from the memory element can be increased by the proposed annealing step.

According to an embodiment of the invention the resistance changeable material is a material whose resistance can be changed electro-thermally by Joule heating in order to program the resistive memory element. When programming the resistive memory element, the voltage pulse exceeding the switching threshold voltage is applied thereby causing localized thermal annealing along the current path through the storage layer due to Joule heating. Voltage pulses for writing data into or programming the memory element have typically durations in the order of nanoseconds.

According to embodiments of the invention the annealing step may be performed for a predetermined annealing time that exceeds a typical time period of e.g. a voltage pulse for programming the carbon-based memory element. In one embodiment the predetermined annealing time is larger than one millisecond. In other embodiments the predetermined annealing time is larger than 10 milliseconds. Another embodiment stipulates an annealing time of at least 60 seconds. One may also contemplate of several minutes annealing time, if, for example, an entire wafer including a plurality of prefabricated memory elements, shall be processed.

In a variant of the method for manufacturing a resistive memory element, the step of annealing includes a heating process of the storage layer at a predetermined temperature of less than 600° C. In an embodiment of the method, the annealing includes a heating process at a temperature less than 500° C. In another embodiment, the annealing takes place at temperatures below 400° C. In yet another embodiment of the method, the annealing includes a heating process at temperatures less than 200° C.

In embodiments of a memory element the storage layer has a thickness between 12 nm and 50 nm. One can also contemplate of storage layers having thicknesses of approximately 20 nm, 25 nm, 40 nm and/or 50 nm. The storage layer may have a thickness between 20 nm and 50 nm. In one embodiment the storage layer has a thickness between 5 nm and 10 nm.

The resistance changeable material may comprise carbon. According to an embodiment of the invention the resistance changeable material is amorphous carbon. It may be an advantage that the mono-atomic nature of carbon allows scaling a respective resistive memory element to very small feature sizes. For example, the surface area of the storage layer may correspond to an area having a diameter of 20 nm to 30 nm. Further, carbon is a relatively ubiquitous material and highly resilient to a variety of external stimuli. Therefore, in particular, amorphous carbon is suitable for the resistance changeable material of the storage layer.

When using amorphous carbon, the step of annealing is adapted to increase the average cluster size of sp2-hybridized carbon in the resistance changeable material. Investigations of the applicant have shown that by annealing the average size of sp2-hybridized carbon structures can be changed. For example, through annealing at relatively low temperatures, the current-voltage curve of the resistive memory element can be significantly altered. It is in particular possible to change the programming behavior/programming curves of a resistive memory element by annealing. The mechanism of this atomic reordering in the carbon storage layer may be due to a facilitated development of aromatic benzene rings in the carbon structure.

According to embodiments of the invention the resistance changeable material comprises more sp3-hybridized carbon than sp2-hybridized carbon. For example, a ratio of sp3-carbon and sp2-carbon is more than 1. sp3-rich carbon can also be called diamond-like carbon or tetrahedral carbon.

According to embodiments of the invention the step of annealing is adapted so as to exclude an increase of the fraction of sp3-hybridized carbon in the resistance changeable material. While conventional annealing processes usually occur at very high temperatures leading to a conversion of sp3 to sp2, in this disclosure, low annealing temperatures are proposed that generally exclude such a conversion into the lower resistivity providing sp2-carbon variant.

In one embodiment of the method, the step of annealing may comprise applying a laser pulse locally onto the storage layer. One may irradiate an appropriate laser pulse thereby increasing the local temperature and triggering an annealing process for tailoring the write and read properties of the resistive memory element along the lines stated above. The laser pulse may be longer than a conventional laser pulse for programming the memory element.

In one embodiment, the method further comprises the steps of: providing a substrate; depositing a conducting material onto the substrate as the bottom contact layer; depositing the resistance changeable material onto the bottom contact layer; and depositing a conducting material onto the substrate as the top contact layer.

The step of depositing may comprise a sputtering process. The substrate may be for instance silicon. A potential conducting material is titanium nitride (TiN) or molybdenum (Mo). The resistance changeable material is amorphous carbon.

Additionally, the method may comprise the step of doping the resistance changeable material with a dopant material. It has been found that also by doping the programming characteristics and reading characteristics of a resistive memory element can be changed and adapted to the needs of the application. The doping material, for example, comprises a transition metal. According to embodiments of the invention titanium (Ti), vanadium (V), zirconium (Zr) or tungsten (W) are chosen as dopant material. The dopant material can also be hydrogen (H) and/or nitrogen (N). In certain embodiments elements of group I and/or Group V of the periodic table may be used as dopants.

When using amorphous carbon as resistance changeable material, the dopant can be in particular hydrogen or nitrogen. By doping amorphous carbon as resistance changeable material with hydrogen or nitrogen, the atomic order of the amorphous carbon can be changed. Dopants may induce the creation of additional sp2-hybridized carbon in the amorphous carbon. Additional sp2-carbon fractions lead to a change of the I-V characteristics of the memory element. Thereby the properties of the memory element can be changed and adapted to the needs of the particular application of the memory element.

According to a further embodiment of the invention the method for manufacturing further comprises a measuring step for measuring one or more characteristics of the resistive memory element, in particular the programming voltage or the programming power of the memory element or the resistance window of the memory element, performing the annealing step and/or the doping step if one or more measured characteristics are out of a predefined tolerance range.

According to embodiments of the invention the resistance changeable material comprises a given ration of sp3-hybridized carbon with respect to sp2-hybridized carbon. The ratio can be sp3/sp2>1. However, also other ratios such as be sp3/sp2>0.5, sp3/sp2>1.5, or sp3/sp2>3 can be contemplated as certain embodiments.

According to an embodiment of another aspect of the invention a resistive memory element is provided comprising a bottom contact, a top contact and a storage layer disposed between the bottom contact and the top contact. The storage layer comprises a resistance changeable material that has been annealed at a predetermined temperature over a predetermined annealing time in order to reduce the programming voltage or the programming power of the memory element or in order to tune the resistance window of the memory element.

Additionally, the storage layer may comprise a dopant material. In one embodiment, the doping percentage is less than 20%. In one embodiment of the memory element, at least the bottom contact layer can comprise titanium nitride embedded in a silicon dioxide (SiO2) material.

In embodiments of a memory element the storage layer has a thickness between 12 nm and 50 nm. One can also contemplate of storage layers having thicknesses of approximately 20 nm, 25 nm, 40 nm and/or 50 nm. The storage layer may have a thickness between 20 nm and 50 nm. In one embodiment the storage layer has a thickness between 5 nm and 10 nm.

The memory element may have at least the bottom contact layer comprising a conductive electrode embedded in an insulating material. For example, a titanium nitride electrode can be embedded in silicon dioxide. The memory element can for example have a geometrical structure similar to conventional phase change memory mushroom cells.

According to an embodiment of a further aspect of the invention an integrated circuit is provided including a plurality of memory elements as disclosed above, wherein the memory elements are arranged as an array between crossings of word lines and bit lines. Each memory element has an assigned selection device. The bit lines and word lines may be arranged essentially perpendicular to one another.

According to an embodiment of a further aspect of the invention a method is provided for manufacturing an integrated electronic circuit including the above mentioned steps or aspects of a method for manufacturing a resistive memory element. The method further comprises the step of providing additional circuitry. According to an embodiment of the invention the step of annealing is carried out after manufacturing the memory elements or after providing the additional circuitry. This can have the advantage that even after manufacturing or producing e.g. a basic memory element, a memory device comprising a resistive memory element, a complete integrated circuit or a wafer, the read and write characteristics of the manufactured elements or devices can still be adapted or fine-tuned by the annealing step.

When electronic devices are fabricated, usually wafer structures carrying a plurality of devices are employed. According to embodiments of the invention the annealing step is applied to an entire wafer by heating the entire wafer in order to tailor the programming characteristics and/or the resistance window of the memory elements of the wafer. One may refer to a bulk annealing process affecting the entire structure containing memory elements and other circuitry. According to an embodiment of the invention the annealing step is performed by arranging resistive memory elements, a wafer comprising resistive memory elements or integrated circuits comprising resistive memory elements in an oven at a predetermined temperature over a predetermined annealing time.

The additional circuitry may comprise a transistor for selecting the memory element, a diode for selecting the memory element, a sense of amplifier, bit lines or word lines.

According to one embodiment of the method and devices the resistive memory elements are non-volatile memory elements or memory cells.

In one embodiment, the contact layers are adapted to allow a current through the storage layer. Moreover, the contact layers may be adapted to record or measure a lateral current through the storage layer of the resistance changeable material.

As will be appreciated by one skilled in the art, aspects of the present invention may be embodied as a system, method or computer program product. For example, manufacturing methods detailed herein can be implemented in software that executes on hardware. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As used herein, "resistance changeable material" refers to a material suitable for use in a resistive memory element or resistive memory cell. It is understood that a resistance changeable material can be characterized by its electric transport properties, and a resistance change is equivalent to a change in resistivity, conductance, conductivity or the current-voltage (I-V) characteristic. A resistance change may occur as function of an external stimulus such as a program voltage pulse or the application of heat, for example by a laser pulse.

"Annealing" essentially refers to a heat treatment of the material thereby changing the atomic structure of the material. Annealing may be performed under a controlled atmosphere preserving the material to be annealed from undesired oxidation or other chemical processes.

The term "layer", in particular relating to a contact layer, is to be understood as region comprising a material. Layer shall not be construed as to relate to a flat or thin geometry. Rather layer stands for a region or a section that may also have an essentially cube-like or block-like shape in this disclosure.

Figure 1:
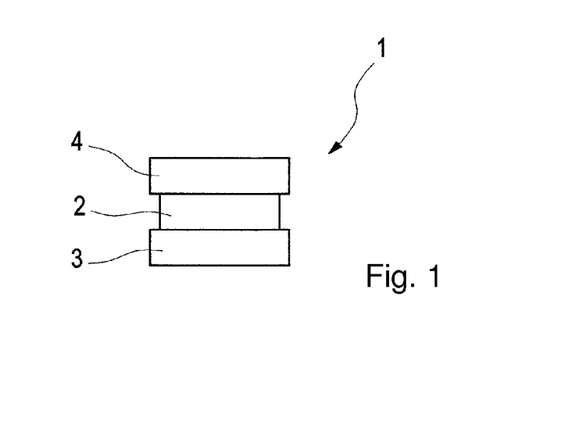
FIG. 1 shows a schematic diagram of a first embodiment of a resistive memory element.

Referring now to FIG. 1, which shows a schematic diagram of a resistive memory element, general properties of resistive memory elements manufactured by the methods according to embodiments of the invention are explained. The resistive memory element 1 comprises a bottom conductive layer 3 used as a first electrode, a storage layer 2 comprising resistance changeable material, as for example, amorphous carbon and a top contact layer 4. The storage layer 2 is sandwiched between the bottom contact layer 3 and the top contact layer 4 acting as electrodes. To use the resistive memory element in a memory cell, a selection device (not shown), such as a transistor, a diode, or another active device, may be coupled to the bottom electrode 3 or to the top electrode 4 to control the application of a current or a voltage to or through the storage layer 2. The storage layer 2 comprises a doped resistance changeable material suitable for resistive memory elements.

One embodiment of the resistivity changing memory element uses carbon, in particular amorphous carbon, as a resistivity changing material. A variant of amorphous carbon that is rich in sp3-hybridized carbon is used that has a relatively high resistivity. Generally, a variant of amorphous carbon that is rich in sp2-hybridized carbon has a relatively low resistivity. This difference in resistivity can be used in a resistivity changing memory cell. Conventionally, a thermally induced conversion from sp3 into sp2-carbon and vice versa was used to program a resistive memory cell. However, investigations of the applicant have shown that by localized thermal annealing due to Joule heating clusters of sp2-carbon, e.g. in terms of coupled benzene rings, may be formed. This can lead to lower resistive filaments of sp2-rich carbon along the current path of a programming voltage pulse applied through the storage layer 2.

The resistivity of the storage layer can be programmed, for example, by imposing a programming voltage pulse. The contact layers or electrodes 3, 4 adapted to record a lateral current to the storage layer of the resistance changeable material employing measurements or circuitry which is not explicitly shown in FIG. 1. For example, a current may be driven through the storage layer 2 (or a voltage may be applied across the storage layer 2). To read out the memory, i.e. to determine the memory state of a resistivity changing memory element, a sensing current may be routed laterally through the material of the storage layer 2 (or a sensing voltage may be applied across the storage layer 2), thereby sensing the resistivity of the resistive memory element 1, which represents the memory state of the memory element. By tuning the I-V characteristics of the memory elements in terms of a switching threshold and resistivity window also a plurality of memory states corresponding to predetermined resistance values could be contemplated. This can be achieved by doping the storage layer material appropriately.

Figure 2:
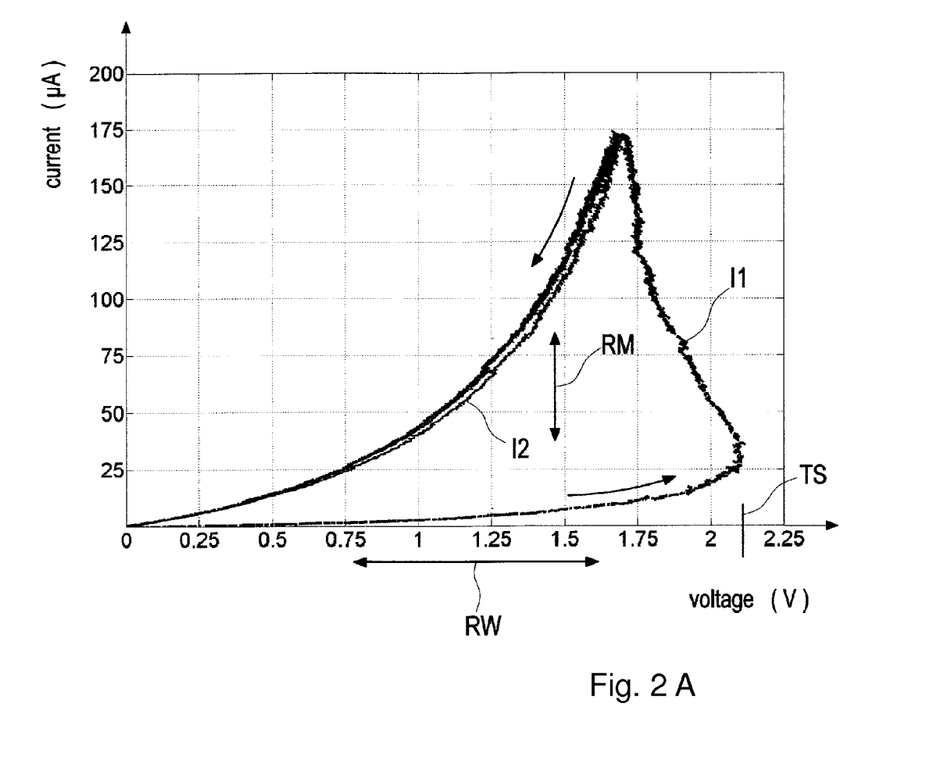
FIG. 2 shows a current-voltage characteristic of a resistive memory element.
Figure 2B:
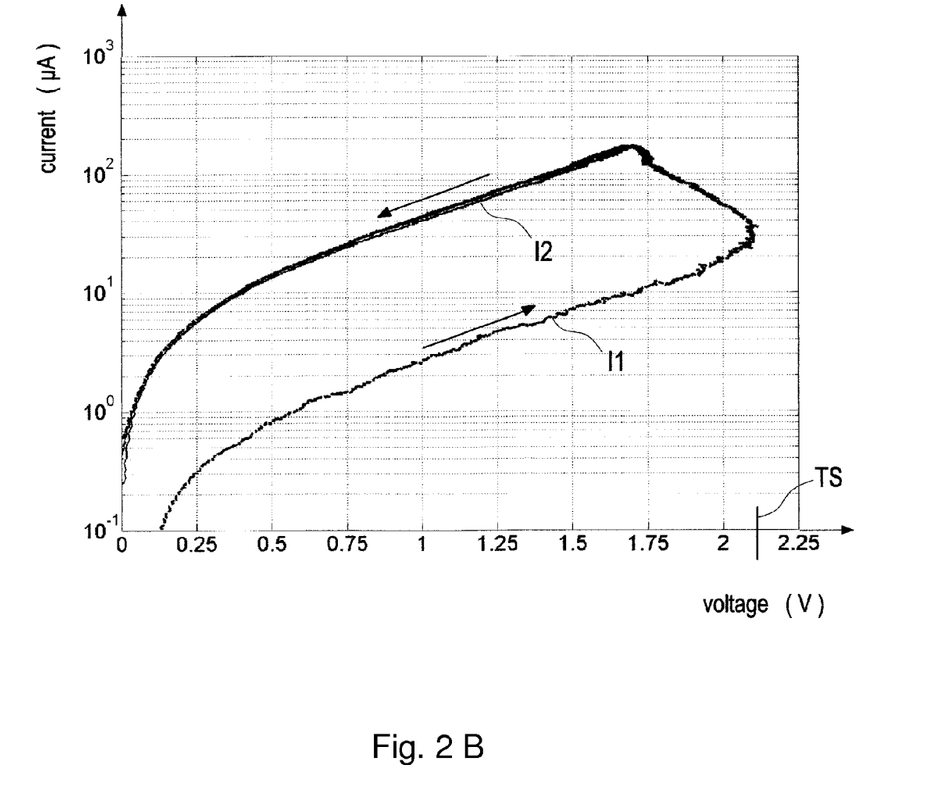

FIG. 2 shows a current voltage characteristic (I-V) of a carbon based resistive memory element as, for example shown in FIG. 1. In FIG. 2A current-voltage curves with a linear scale are illustrated while FIG. 2B shows a logarithmic representation of the same curve. The curves I1, I2 are obtained by the application of a triangular voltage pulse over approximately 2 µs, wherein the voltage runs along the arrows attached to the curves I1 and I2. FIG. 2 shows that the I-V measurement according to curve I1 first shows a non-linear increase in the current as a function of the applied voltage. At a certain voltage TS, the resistivity drops significantly and reaches a minimum at about 175 µA. When lowering the applied voltage V again the resistivity of the memory element remains changed in respect to the first part of the curve I1.

The solid line I2 refers to a second measurement which follows the return path of the first I-V curve I1. One can derive from the I-V characteristics shown in FIG. 2 that by applying a voltage pulse exceeding or reaching a switching threshold voltage TS, the resistivity of the storage layer 2 can be permanently altered. In principle, one can program multiple levels of resistance or resistivity by varying the pulse amplitude for the programmable voltage. The resistance margin or resistance window RM is indicative for the number of logic states that can be stored with a resistive memory cell. It may be desirable to have an extensive resistance margin RM and a wide read voltage window RW as indicated in FIG. 2.

It is therefore desirable to adapt the resistance margin RM, the threshold switching voltage TS and the read voltage window according to the needs of an application for the resistive memory element. Embodiments of the invention provide for mechanism for adapting the current voltage-characteristics of the used materials in the resistive memory element.

Investigations of the applicant have shown that in particular by annealing the resistance changeable material in the storage layer 2, the I-V characteristic of the respective resistive memory element can be tailored to the needs of the application.

Figure 3:
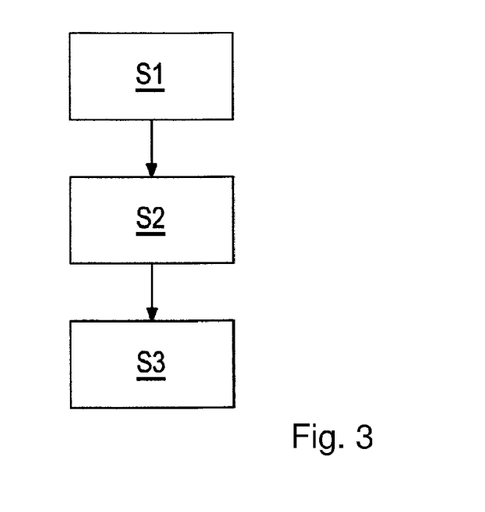
FIG. 3 shows a flow diagram with method steps for manufacturing a resistive memory element in accordance with an embodiment of the disclosure.

FIG. 3 shows a flow diagram of an embodiment of the method for manufacturing a resistive memory element.

In a first step S1, a storage layer comprising a resistance changeable material as for example amorphous carbon having a high sp3-hybridized carbon fraction is provided.

In a second step S2, contact layers for contacting the storage layer are provided. The storage layer is disposed between a bottom conductive layer and a top conductive layer as for example shown in FIG. 1. As an example, TiN or Mo can be used as conductive layers for forming contacts.

In a next step S3, an annealing process is performed. By the annealing an atomic order of the resistance changeable material can be rearranged, thereby changing the I-V characteristic of the memory element. In particular, the programming voltage or programming power (relating to the switching threshold TS) and the resistance window RM of resistive memory element may be altered. For example, using amorphous carbon as resistance changeable material, the annealing process may enhance the creation of sp2-hybridized carbon clusters. Investigations of the applicant suggest that the increase of the average cluster size of sp2-carbon leads to a reduced programmable voltage.

The annealing temperatures are adapted so as to avoid a conversion of sp3 to sp2 carbon. Rather the annealing exclusively induces the increase of the average size of sp2 clusters in the amorphous carbon layer.

The process of annealing may be implemented at any time during a manufacturing process for a memory element or during the formation of a device including such a memory element. Therefore, one may adapt given memory elements to obtain appreciated I-V characteristics.

Figure 4:
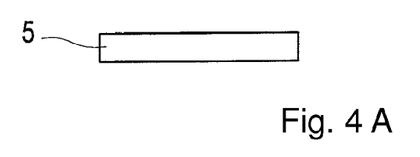
FIG. 4 illustrates method steps involved in the formation of a resistive memory element.

FIG. 4 illustrates method steps and aspects involved in one embodiment of a method for producing a resistive memory element or memory cell. In FIG. 4A a silicon substrate 5 is provided for further processing.

As shown in FIG. 4B, next a conducting layer 6 is deposited onto the silicon substrate 5, for example by sputtering. The conducting layer eventually acting as an electrode may comprise titanium nitride, molybdenum or vanadium.

Next, the storage layer 2 comprising carbon is sputtered onto the conducting layer 6. This is shown in FIG. 4C. For example, carbon can be dc-sputtered onto the conducting layer 6. For example, the thickness of the conductive layer 6 may be approximately 40 nm, and the carbon layer or storage layer 2 may have a thickness of 12 nm. However, one can also contemplate of other thicknesses such as 20, nm, 25 nm, 45 nm or 50 nm for the storage layer. As a result, an amorphous nitrogen-doped carbon layer suitable as resistive memory is produced. By choosing the dopant and doping percentage the resulting current-voltage characteristic may be engineered according to the needs of the device or application.

As shown in FIG. 4D, a top electrode 7 is provided. In order to perform measurements on the I-V characteristics of the storage layer 2, the top electrode may be a conducting tip of an atomic force microscope (AFM) setup. Additional circuitry which not shown explicitly in FIG. 4 may comprise a digital-to-analog converter, a logarithmic amplifier and a digital signal processor (DSP) for measuring the I-V characteristic laterally through the storage layer. The general form of an I-V characteristic of a resistive memory element is shown in FIG. 2 above.

For some applications it may be desirable to reduce the programming voltage, i.e. the switching threshold voltage of a given resistive memory cell structure. According to embodiments of the presented method for manufacturing a resistive memory element, this can be achieved by an appropriate annealing process.

Referring again to the method illustrated in FIG. 4, often many memory elements and potentially other electronic circuitry are disposed on a bulk substrate material or a wafer structure. According to embodiments of the invention the proposed tailoring of the current voltage characteristics by annealing is used to treat the entire wafer or substrate with the memory. In other words, a bulk treatment or bulk annealing may be performed. According to an embodiment of the invention the wafer or substrate is annealed in an oven.

Figure 5:
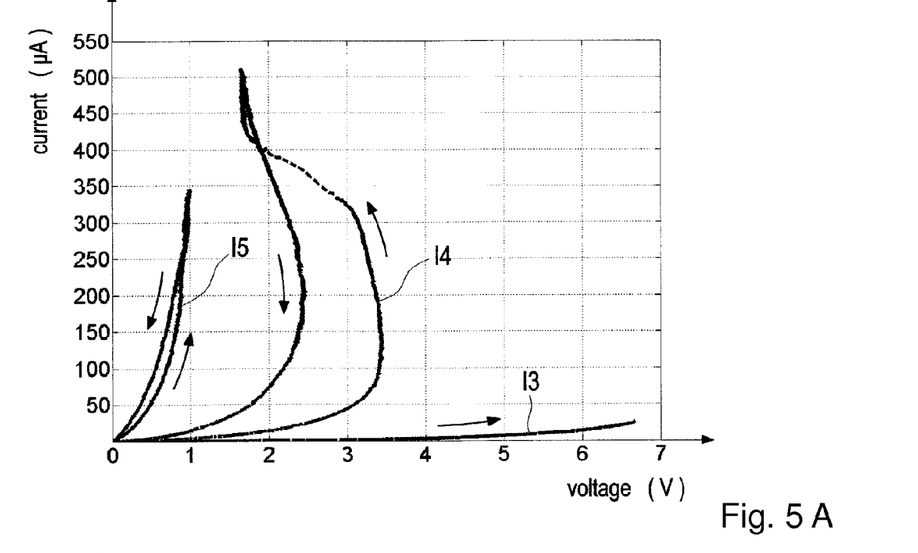
FIGS. 5 and 6 show current-voltage characteristics of resistive memory elements produced according to the presented method comprising an annealing process.

For example, FIG. 5 shows results for an I-V measurement on a resistive element having the structure of FIG. 4D. The thickness of the amorphous carbon layer, i.e. the storage layer is approximately 50 nm. In FIG. 5A current-voltage curves with a linear scale are illustrated while FIG. 5B shows a logarithmic representation of the same curve. The I-V curve I3 corresponds to the resistive memory element annealed for five minutes in an argon environment at 400° C. The I-V curve I4 corresponds to the resistive memory element annealed for five minutes in argon at 500° C. The curve I5 corresponds to the resistive memory element annealed for five minutes in argon at 600° C. The annealing time is according to embodiments of the invention considerably longer than a thermally induced programming of the memory elements. As an example, voltage or laser pulses used to program the devices are on a shorter time scale of the order of nanoseconds.

FIG. 5 shows that by annealing the programming voltage or the switching threshold can be reduced. One can observe that the higher the annealing temperature the lower the switching voltage. Therefore, through annealing a pre-produced resistive memory element having an excessively high programming voltage (as for example curve I3 in FIG. 5) the device can be adapted to have a reasonable threshold switching voltage.

Figure 6A:
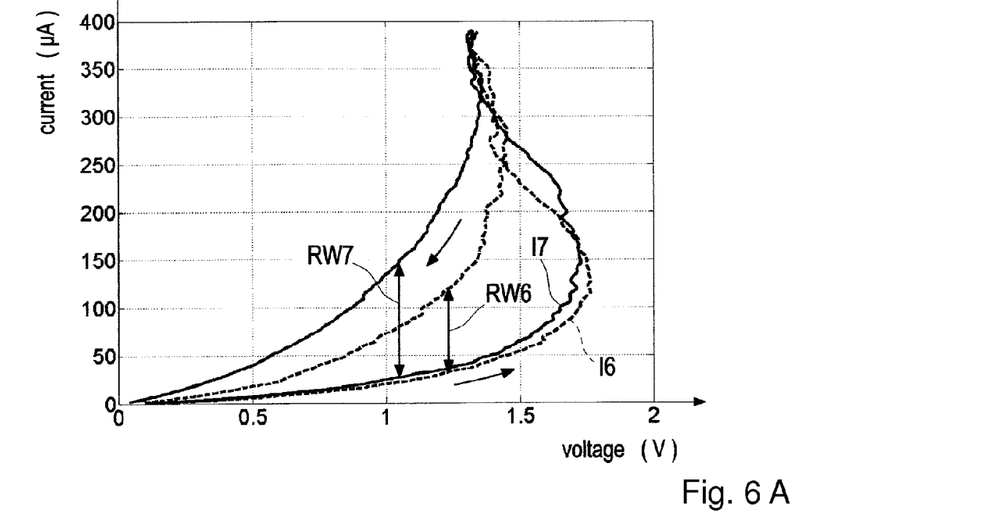
Figure 6B:
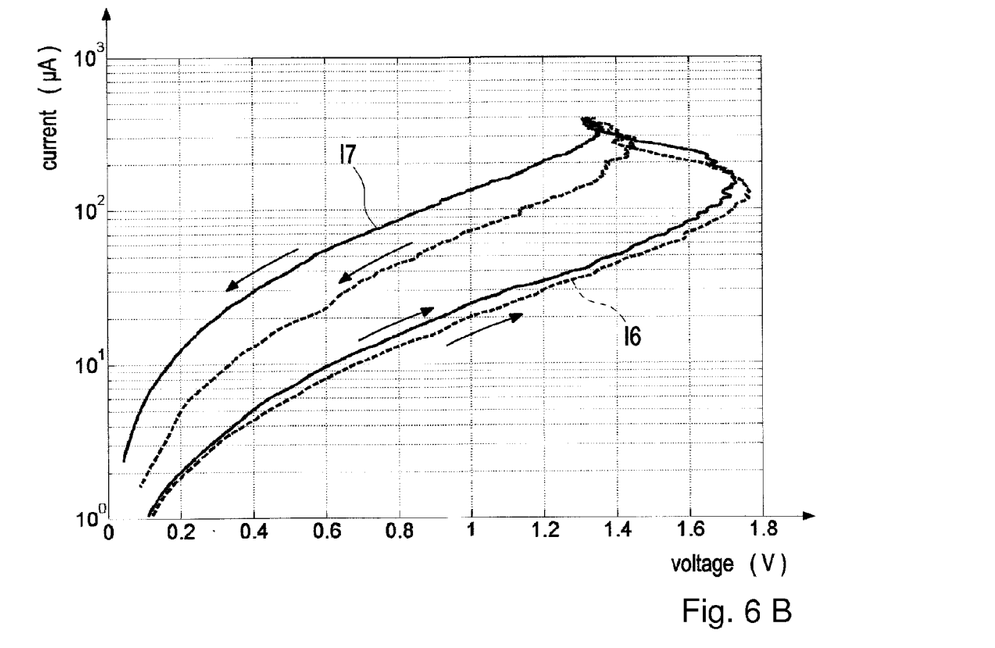

FIG. 6 shows another example for an annealing process altering the I-V characteristics of a given resistive memory element. FIG. 6 shows the I-V characteristic of a resistive memory element having the structure as shown in FIG. 4D with a storage layer thickness of 25 nm. In FIG. 6A current-voltage curves with a linear scale are illustrated while FIG. 6B shows a logarithmic representation of the same curves. The dotted curve I6 shows the I-V curve of the device without annealing. A representative resistance window RW6 is also shown in FIG. 6A for curve I6. By imposing an annealing process for five minutes in argon at 200° C. (solid curve I7) the I-V curve for the device is altered. In particular, the resistance window RW7 is significantly increased with respect to the device without annealing (see I6). The larger resistance window facilitates the programming or setting of multiple resistance levels in the respective memory element.

In addition to imposing an annealing process to a fabricated resistive memory element structure, one can also tailor the programmable characteristics and resistance windows of carbon based memories by doping the storage layer or the resistance changeable material, respectively.

Figure 7A:
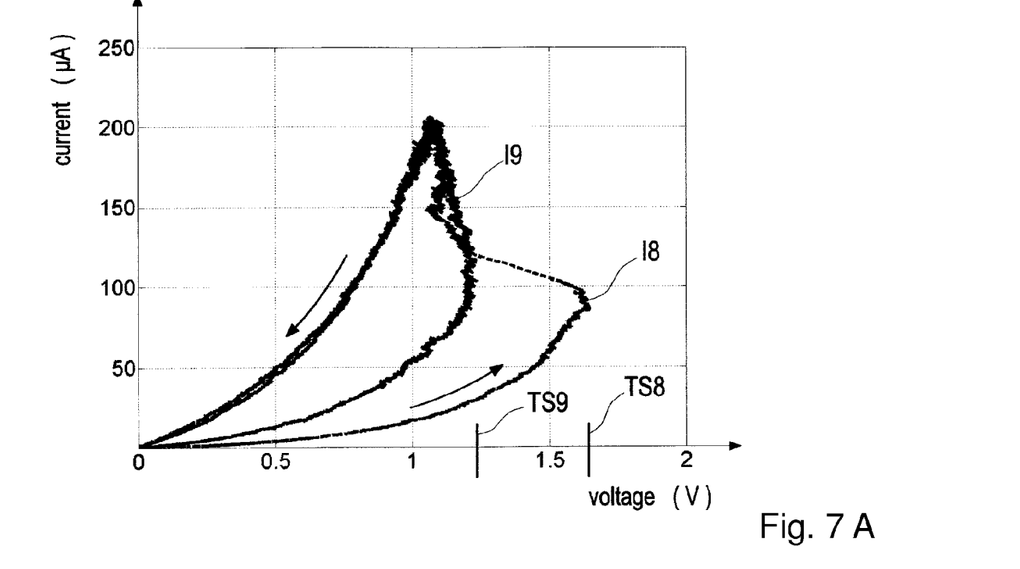
FIGS. 7 and 8 show current-voltage characteristics of some embodiments of resistive memory element produced according to the presented method comprising a doping process.
Figure 7B:
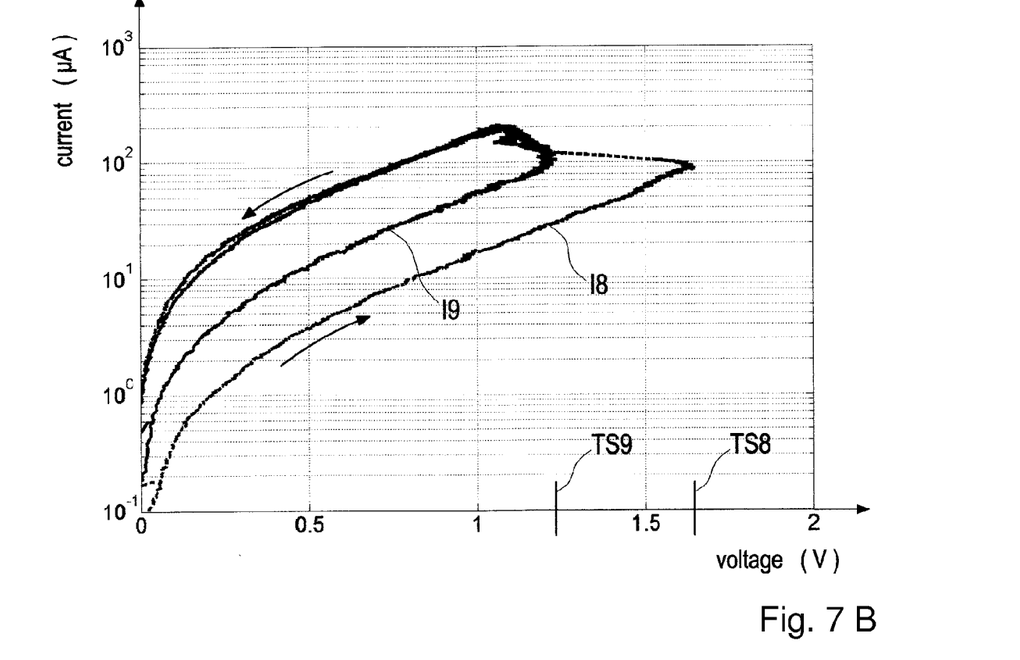

FIG. 7 shows the effect of doping an amorphous carbon layer as storage layer with nitrogen. The corresponding resistive memory element has the structure as shown in FIG. 4D with a 40 nm titanium nitride bottom conductive layer and a 12 nm amorphous carbon layer as storage layer. In FIG. 7A current-voltage curves with a linear scale are illustrated while FIG. 7B shows a logarithmic representation of the same curves. Curve I8 in FIG. 7 corresponds to the un-doped memory element, and curve I9 corresponds to the storage layer doped with nitrogen. One can see from FIG. 7 that due to the nitrogen doping the programming voltage, i.e. the switching threshold voltage is reduced. Hence, by doping the storage layer or the resistance changeable material, respectively, a resistive memory element can be manufactured that is tailored to the needs of the respective application for the memory element.

Figure 8:
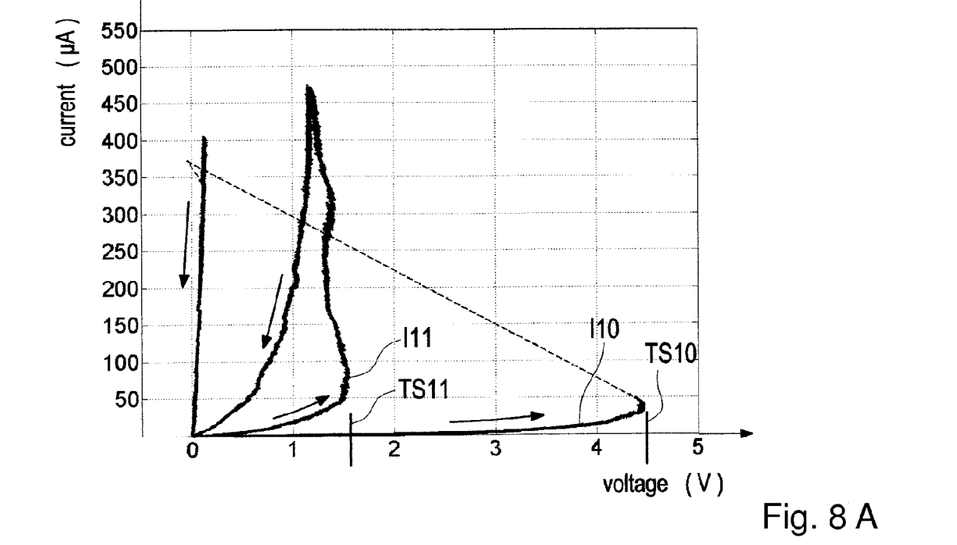

FIG. 8 shows the I-V characteristics of a memory element having the structure as shown in FIG. 4D, wherein the amorphous carbon or storage layer has a thickness of 25 nm. To achieve hydrogen doping of the amorphous carbon, the carbon layer is sputtered in a mixture of 98% argon and 2% hydrogen. In FIG. 8A current-voltage curves with a linear scale are illustrated while FIG. 8B shows a logarithmic representation of the same curves. Curve I10 corresponds to a hydrogen-doped memory element, and curve I11 corresponds to an un-doped memory element. One can see from the curves in FIGS. 8A and 8B that by hydrogen doping the programming voltage is significantly increased from TS11 about 1.6 V to TS10 about 4.5 V. One can further see that the resistance window is enlarged by the hydrogen doping.

In the illustrated embodiments with respect to the I-V curves in FIGS. 7 and 8 the different dopants have opposing effects on the switching threshold. Nitrogen decreases the switching threshold, and hydrogen increases the switching threshold. Therefore, one may tailor the properties of a respective memory element to the specific needs of its application by doping appropriately.

Figure 9:
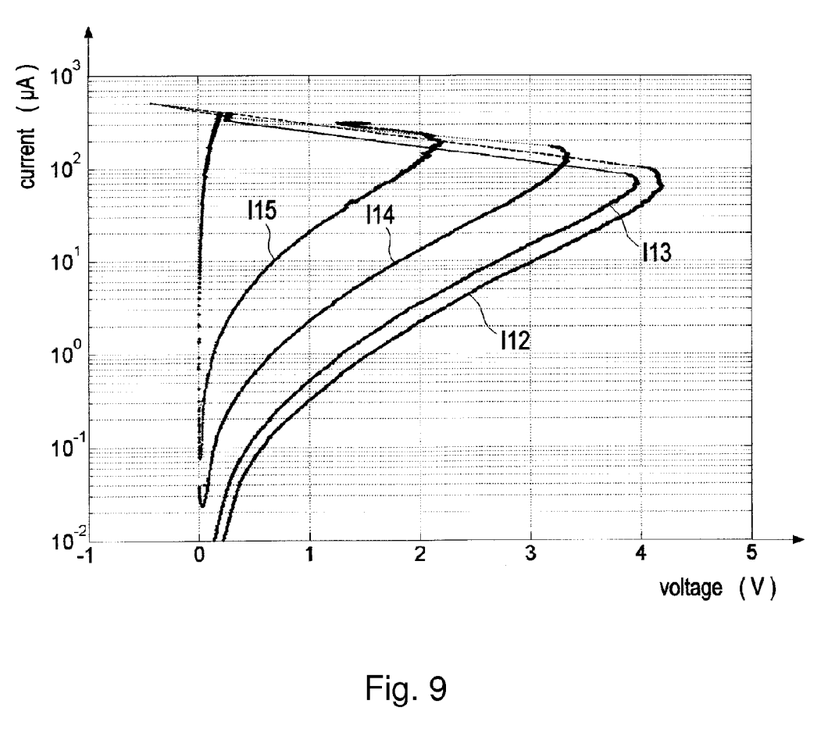
FIG. 9 shows current-voltage characteristics of resistive memory elements produced according to the presented method comprising an annealing process and a doping process.

One may also contemplate of combining an annealing process with doping the resistance changeable material, as for example, amorphous carbon. FIG. 9 shows the combined effects of annealing a resistive memory element and doping the resistance changeable material used in the memory element. The curves in FIG. 9 correspond to a resistive memory element structure which is comparable to the one discussed with respect to FIG. 6. The amorphous carbon was doped with hydrogen and eventually annealed at 200° C. (curve I13), at 300° C. (curve I14), and at 400° C. (line 15). Curve I12 corresponds to the un-annealed memory element with hydrogen doping The proposed methods for manufacturing tailor-made resistive memory elements allow for a variety of applications. In particular, multi-level programming is better achievable when the resistivity window is enhanced. The annealing process can be applied to a ready-made resistive memory cell structure in order to fine tune its characteristics for the desired application. For example, annealing may compensate or enhance effects to the I-V characteristic obtained through doping during the formation process. Annealing may also compensate for impurities in the resistance changeable storage material.

Figure 10:
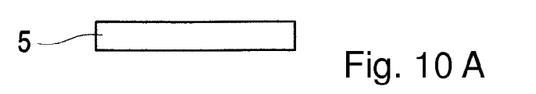
FIG. 10 illustrates method steps involved in an alternative method for producing a resistive memory element.

One can also contemplate of geometrically different structures as those shown in FIG. 4 for the memory element. FIG. 10 illustrates a method for producing an additional embodiment of a resistive memory element. FIG. 10A shows a substrate 5 provided for further processing. The substrate, for example, may comprise silicon.

Next, as shown in FIG. 10B, a silicon oxide layer 8 is provided on the substrate 5. A trench 9 is provided in the silicon oxide layer 8, for example, by an etching process. This is shown in FIG. 10C.

The trench 9 is then filled with titanium/titanium nitride, for example, by sputter deposition and subsequent chemical-mechanical polishing. The titanium nitride 10 is surrounded by the isolating silicon oxide 8 and acts as bottom electrode.

Next, an amorphous carbon layer is sputtered onto the structure as shown in FIG. 10E. Thereby a storage layer 2 is formed. Contemporaneously, the carbon can be doped, for example with nitrogen or hydrogen. This may be achieved by sputtering the carbon under a hydrogen or nitrogen comprising atmosphere. The doping can also be performed as a separate process according to conventional techniques.

Next, a conducting layer 11 as top electrode is provided. The top electrode can be made of titanium nitride. The memory element as shown in FIG. 10F resembles the structure of a phase change memory mushroom cell. However, also different geometries and structures can be contemplated for a resistive memory element according to this disclosure.

Figure 11:
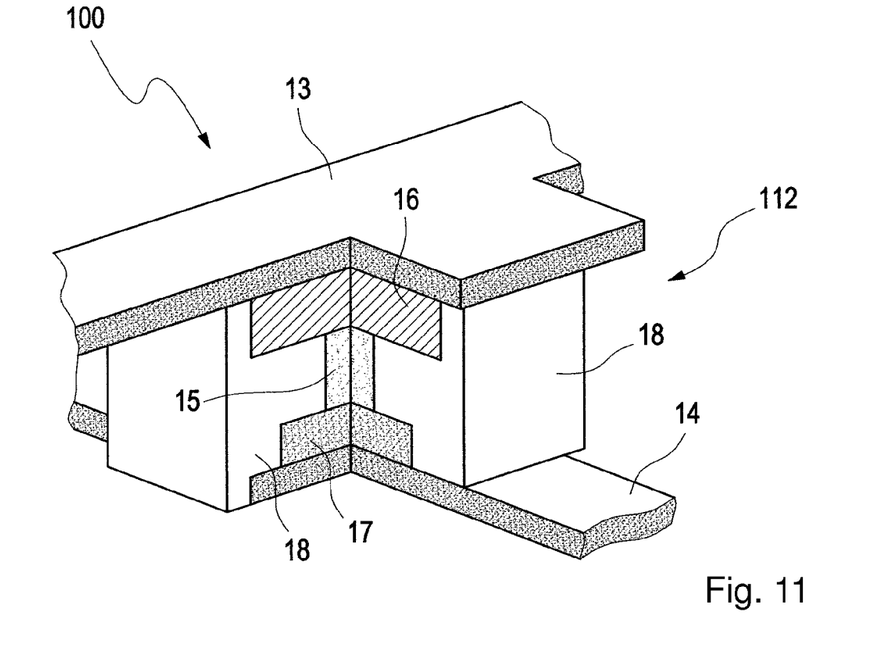
FIG. 11 is a partial perspective view of an embodiment of a memory device including a resistive memory element.
Figure 12:
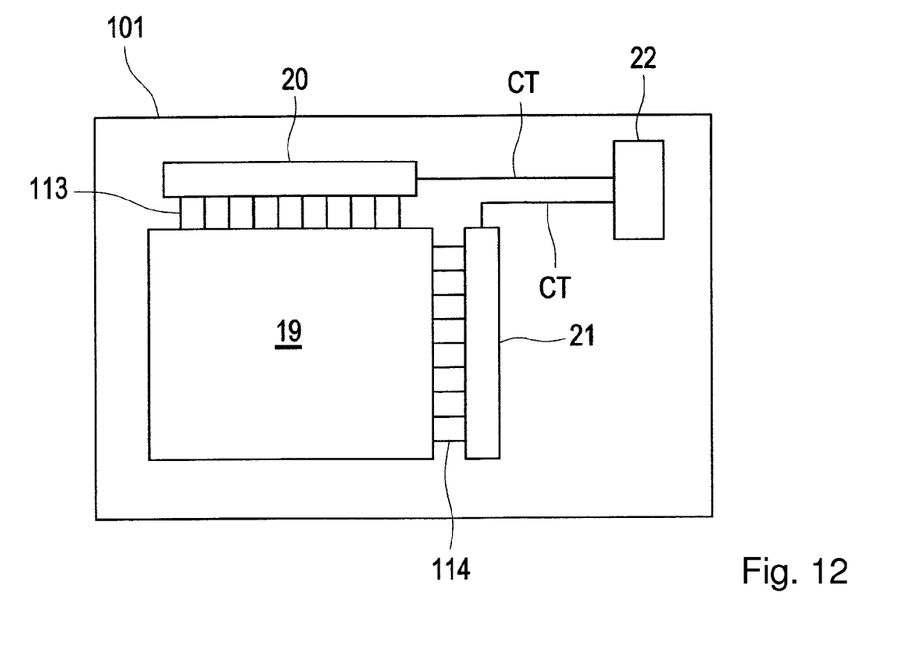
FIG. 12 shows a schematic block diagram of an integrated circuit comprising an array of resistive memory elements.

FIG. 11 shows a section of a memory device including a resistive memory cell or memory element. The perspective view in FIG. 12 shows a word line 14 and a bit line 13 which are essentially perpendicular to each other. At the crossing between the word line 13 and the bit line 14, the resistive memory cell 112 according to this disclosure is placed. The resistive memory cell 112 comprises a contact region 16 which acts as a top electrode, a region 15 comprising resistance changeable material, such as amorphous carbon, and a surrounding isolating material 18, as for example silicon oxide. Further, an access device 17 is assigned to the resistive memory cell 112. The access device can be, for example, a selection transistor or a selection diode. The selection device 17 acts as a bottom electrode in the arrangement shown in FIG. 12.

FIG. 12 shows a block diagram of an integrated circuit with the plurality of resistive memory cells. The integrated circuit 101 has an array 19 comprising memory cell arrangements as shown in FIG. 11, i.e. a plurality of word and bit lines, wherein at the crossings resistive memory elements or memory cells are disposed. The word lines 114 are coupled to a word line decoder 21, and the bit lines 113 are coupled to a bit line decoder 20. The word line decoder and the bit line decoder 21, 20 can be controlled by a control device 22 by appropriate control signals CT.

As mentioned above, the heat treatment, i.e. the annealing, for tailoring the programming characteristics of the carbon-based memory can be imposed on entire integrated circuits and more particularly on wafers or substrates carrying prefabricated memory devices.

The presented methods and devices provide for changing and adapting the read and write characteristics of, in particular, carbon based resistive memory devices according to desired properties. In particular, embodiments of the invention allow adaptation of the programming power, the programming voltage and the read voltage window of a resistive memory device. Therefore, as an example, multi-level programming capability of known devices employing carbon based memory is facilitated.

List of reference characters used herein include:

| | |
|---|---|
| 1 | resistive memory element |
| 2 | storage layer |
| 3 | bottom electrode |
| 4 | top electrode |
| 5 | substrate |
| 6 | conducting layer |
| 7 | electrode |
| 8 | isolating layer |
| 9 | trench |
| 10 | bottom electrode |
| 11 | top electrode |
| 12 | resistive memory element |
| 13 | bit line |
| 14 | word line |
| 15 | resistance changeable material |
| 16 | top electrode |
| 17 | access device |
| 18 | isolating material |
| 19 | memory cell array |
| 20 | bit line decoder |
| 21 | word line decoder |
| 22 | controller |
| 100 | resistive memory device |
| 101 | integrated circuit |
| 112 | resistive memory cell |
| 113 | bit lines |
| 114 | word lines |
| CT | control signal |
| I | current |
| I1-I15 | current curves |
| RM | resistance margin |
| RW6, RW7 | resistance margin |
| S1, S2, S3 | method step |
| TS | switching threshold |
| TS8, TS9 | switching threshold |
| V | voltage |

The flowchart and block diagrams in the Figures illustrate the architecture, functionality, and operation of possible implementations of systems, methods and computer program products according to various embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

What is claimed is:

1. A method comprising:
   providing a storage layer of a resistive memory element comprising a resistance changeable material, said resistance changeable material comprising carbon;
   providing contact layers for contacting the storage layer, wherein the storage layer is disposed between a bottom contact layer and a top contact layer; and
   annealing the resistance changeable material at a predetermined temperature over a predetermined annealing time for rearranging an atomic order of the resistance changeable material, wherein the annealing temperature is adapted to exclude conversion of sp3 state to a sp2 state of the carbon within the resistance changeable material.

2. The method of claim 1, wherein a resistance change of the storage layer is induced electro-thermally by Joule heating for programming the resistive memory element.

3. The method of claim 1, wherein the annealing comprises a heating process at a temperature less than 600° C.

4. The method of claim 1, wherein the storage layer has a thickness between 12 nm and 50 nm.

5. The method of claim 1, wherein the resistance changeable material is amorphous carbon.

6. The method of claim 5, wherein the step of annealing is adapted to increase an average cluster size of sp2-hybridized carbon in the resistance changeable material.

7. The method of claim 5, wherein the resistance changeable material comprises more sp3-hybridized carbon than sp2-hybridized carbon.

8. The method of any one of claim 5, wherein the annealing is adapted so as to exclude an increase of the fraction of sp3-hybridized carbon in the resistance changeable material.

9. The method of claim 1, further comprising:
   providing a substrate;
   depositing a conducting material onto the substrate as the bottom contact layer;
   depositing the resistance changeable material onto the bottom contact layer for forming the storage layer; and
   depositing a conducting material onto the storage layer as the top contact layer.

10. The method of claim 1, further comprising:
    doping the resistance changeable material with a dopant material.

11. The method of claim 10, wherein the dopant material comprises hydrogen (H), nitrogen (N) or a transition metal.

12. The method of claim 1, wherein the resistive memory element is part of an integrated electronic circuit, said method further comprising:
    providing additional circuitry before the annealing of the resistance changeable material.

13. The method of claim 12, wherein the additional circuitry comprises at least one of the group of: a transistor for selecting the memory element, a diode for selecting the memory element, a sense amplifier, bit lines and word lines.

14. The method of claim 12, wherein the contact layers are adapted to record a lateral current through the storage layer of the resistance changeable material.

15. A resistive memory element prepared by a process comprising the steps of:
    providing a storage layer of a resistive memory element comprising a resistance changeable material, said resistance changeable material comprising carbon;
    providing contact layers for contacting the storage layer, wherein the storage layer is disposed between a bottom contact layer and a top contact layer; and
    annealing the resistance changeable material at a predetermined temperature over a predetermined annealing time for rearranging an atomic order of the resistance changeable material, wherein the annealing temperature is adapted to exclude conversion of sp3 state to a sp2 state of the carbon within the resistance changeable material.

16. The resistive memory element of claim 15, wherein the storage layer has a thickness between 12 nm and 50 nm.

17. The resistive material element of claim 15, wherein the resistance changeable material is amorphous carbon.

18. The resistive material element of claim 15, wherein the resistance changeable material comprises more sp3-hybridized carbon than sp2-hybridized carbon.

19. The resistive material element of claim 15, wherein the resistance changeable material is a material whose resistance is changeable electro-thermally by Joule heating.

20. A manufacturing system for producing a resistive memory element comprising equipment for:
providing a storage layer of a resistive memory element comprising a resistance changeable material, said resistance changeable material comprising carbon;
providing contact layers for contacting the storage layer, wherein the storage layer is disposed between a bottom contact layer and a top contact layer; and
annealing the resistance changeable material at a predetermined temperature over a predetermined annealing time for rearranging an atomic order of the resistance changeable material, wherein the annealing temperature is adapted to exclude conversion of sp3 state to a sp2 state of the carbon within the resistance changeable material.

21. The manufacturing system of claim 20, further comprising equipment for:
providing a substrate;
depositing a conducting material onto the substrate as the bottom contact layer;
depositing the resistance changeable material onto the bottom contact layer for forming the storage layer;
depositing a conducting material onto the storage layer as the top contact layer; and
doping the resistance changeable material with a dopant material.

22. A computer program product comprising a computer readable storage medium having computer usable program code embodied therewith, the computer usable program code is stored in in the computer readable storage medium and is executed by a processor to control manufacturing equipment to generate a resistive memory element, said computer usable program code comprising:
computer usable program code configured to provide a storage layer of the resistive memory element comprising a resistance changeable material, said resistance changeable material comprising carbon;
computer usable program code configured to provide contact layers for contacting the storage layer, wherein the storage layer is disposed between a bottom contact layer and a top contact layer; and
computer usable program code configured to anneal the resistance changeable material at a predetermined temperature over a predetermined annealing time for rearranging an atomic order of the resistance changeable material, wherein the annealing temperature is adapted to exclude conversion of sp3 state to a sp2 state of the carbon within the resistance changeable material, wherein the annealing comprises applying a laser pulse locally onto the storage layer.

23. A method comprising:
providing a storage layer of a resistive memory element comprising a resistance changeable material, said resistance changeable material comprising carbon;
providing contact layers for contacting the storage layer, wherein the storage layer is disposed between a bottom contact layer and a top contact layer; and
annealing the resistance changeable material at a predetermined temperature over a predetermined annealing time for rearranging an atomic order of the resistance changeable material, wherein the annealing comprises applying a laser pulse locally onto the storage layer;
tuning a resistance window of the resistive memory element by the annealing; and
adapting programming characteristics of the resistive memory element according to needs of a target implementation by the annealing, wherein at least one of the programming characteristics adaptable within a range is voltage operations of the resistive memory element.

24. The method of claim 23, further comprising:
applying a set of laser pulses locally to the storage layer to increase the local temperature of the storage layer, thereby triggering the annealing, wherein the adapting, via the applied set of laser pulses, read and write properties of the resistive memory element, wherein the programming characteristics comprise the read and write properties.

* * * * *